United States Patent [19]

Sakamoto et al.

[11] Patent Number: 4,969,207
[45] Date of Patent: Nov. 6, 1990

[54] RADIO RECEIVER WITH RECEPTION DETERIORATION COMPENSATION

[75] Inventors: Masayuki Sakamoto, Yokosuka; Isao Shimizu; Seizo Onoe, both of Yokohama; Mitsuru Murata, Yokosuka, all of Japan

[73] Assignee: Nippon Telegraph and Telephone Corporation, Tokyo, Japan

[21] Appl. No.: 169,501

[22] Filed: Mar. 17, 1988

[30] Foreign Application Priority Data

Mar. 20, 1987 [JP] Japan .................................. 62-63957
Jul. 3, 1987 [JP] Japan ................................. 62-165245

[51] Int. Cl.⁵ ............................................. H04B 11/16
[52] U.S. Cl. .................................... 455/134; 455/303; 455/135
[58] Field of Search ............... 455/133, 134, 135, 179, 455/303, 306, 307, 212, 213; 375/80, 82; 370/6

[56] References Cited

U.S. PATENT DOCUMENTS

| 3,729,682 | 4/1973 | Elder | 455/135 |
|---|---|---|---|
| 4,035,729 | 7/1977 | Perry | 455/135 |
| 4,313,215 | 1/1982 | Jansen | 455/212 |

Primary Examiner—Joseph A. Orsino
Assistant Examiner—Frank M. Scutch, III
Attorney, Agent, or Firm—Cushman, Darby & Cushman

[57] ABSTRACT

A receiver for receiving angle-modulated radio signals includes detecting occurrence of interference from adjacent channels when an envelope of demodulated signal of the received radio signals exceeds a threshold. This receiver improves the quality of received signals, attenuates them, limits the amplitude thereof, or blocks them and to insert interpolation signals in replacement thereof when the detection output is transmitted thereto.

4 Claims, 20 Drawing Sheets

FIG. 5 (I)
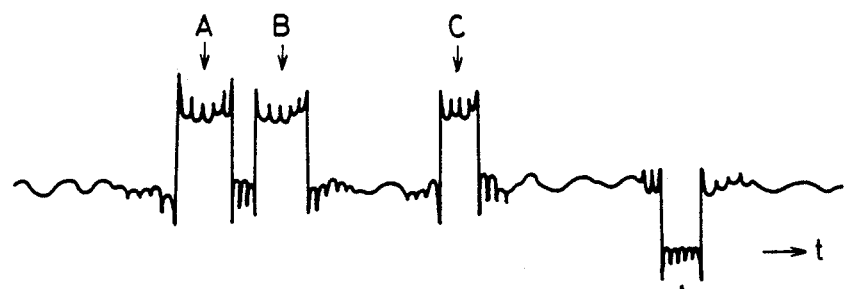
FIG. 5 (II)
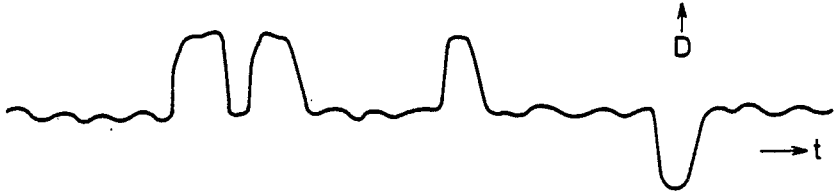
FIG. 5 (III)
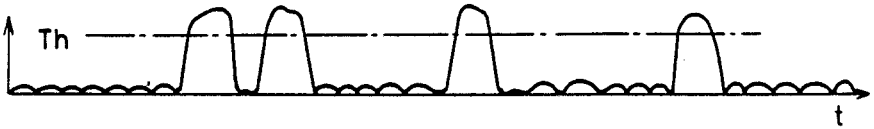
FIG. 5 (IV)
FIG. 5 (V)
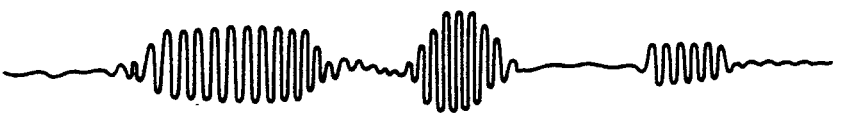
FIG. 5 (VI)

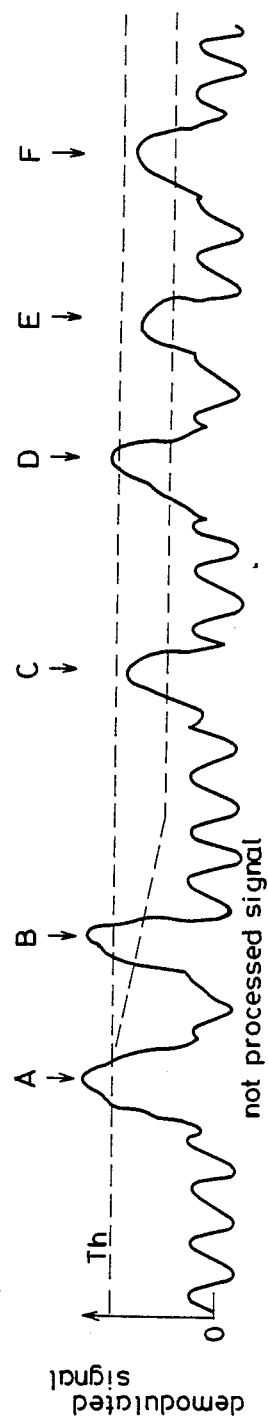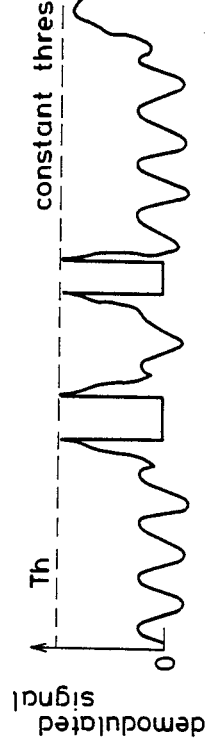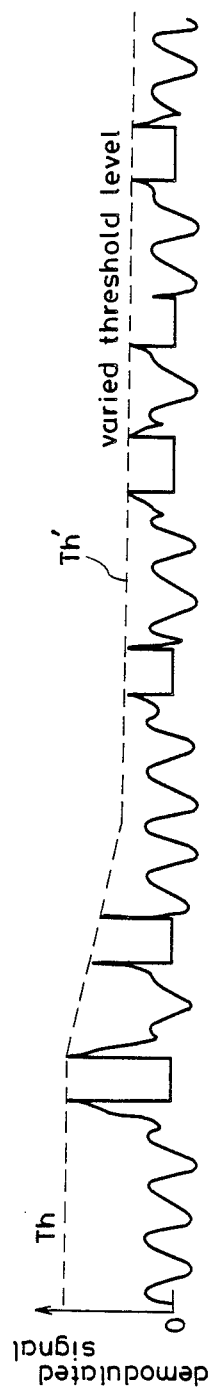

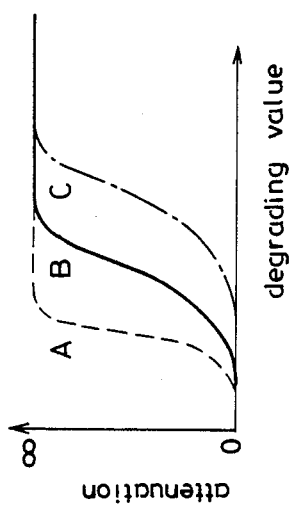
FIG. 8A
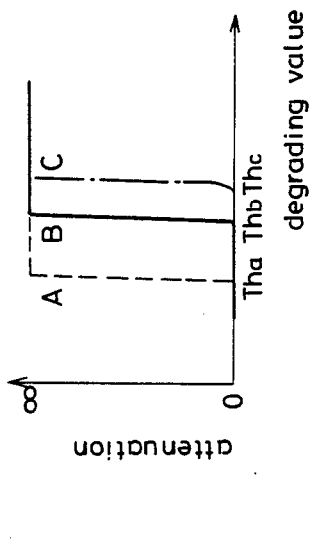
FIG. 8B
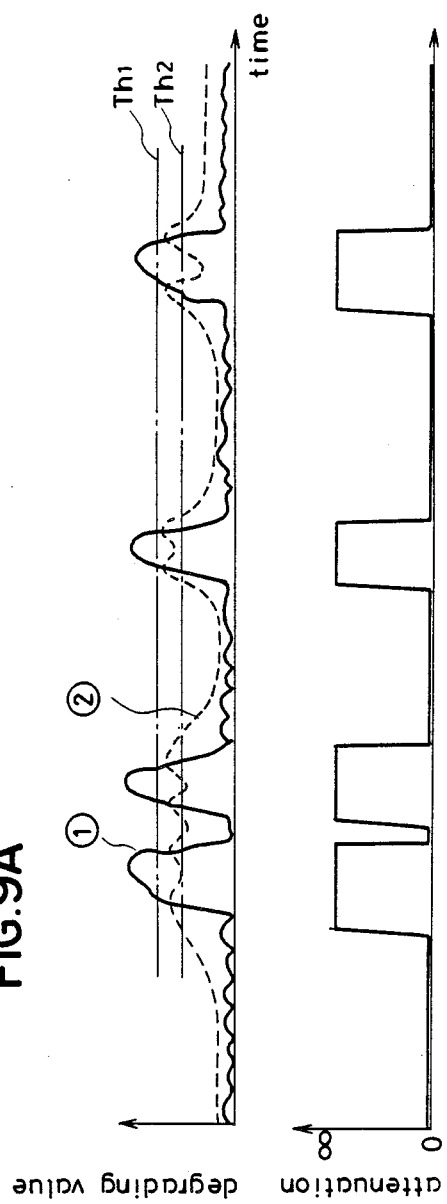
FIG. 9A
FIG. 9B

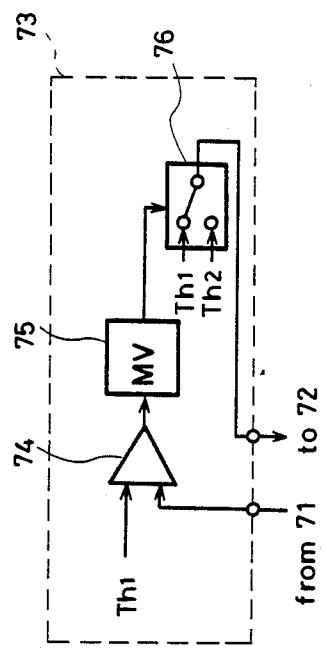
FIG. 12
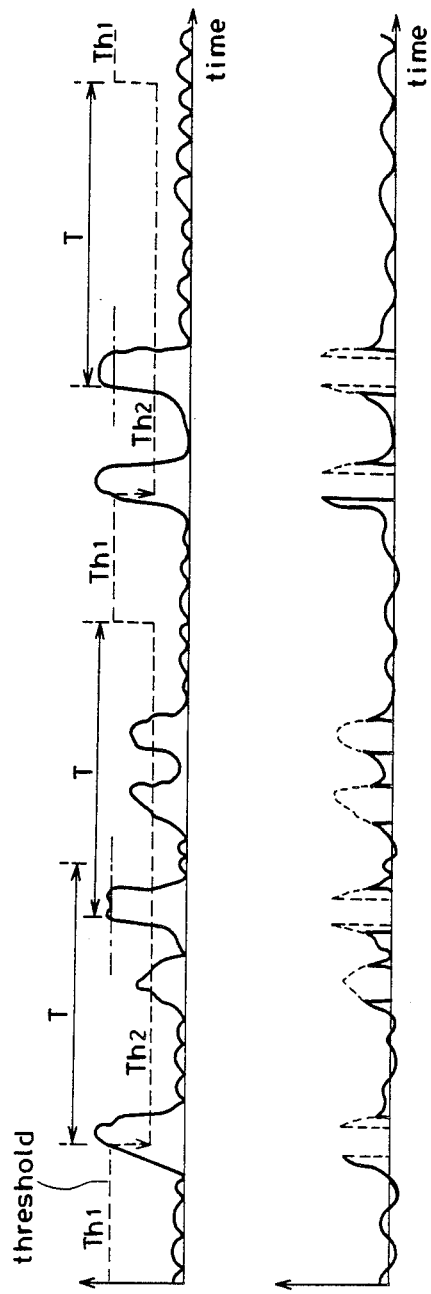
FIG. 13A
FIG. 13B

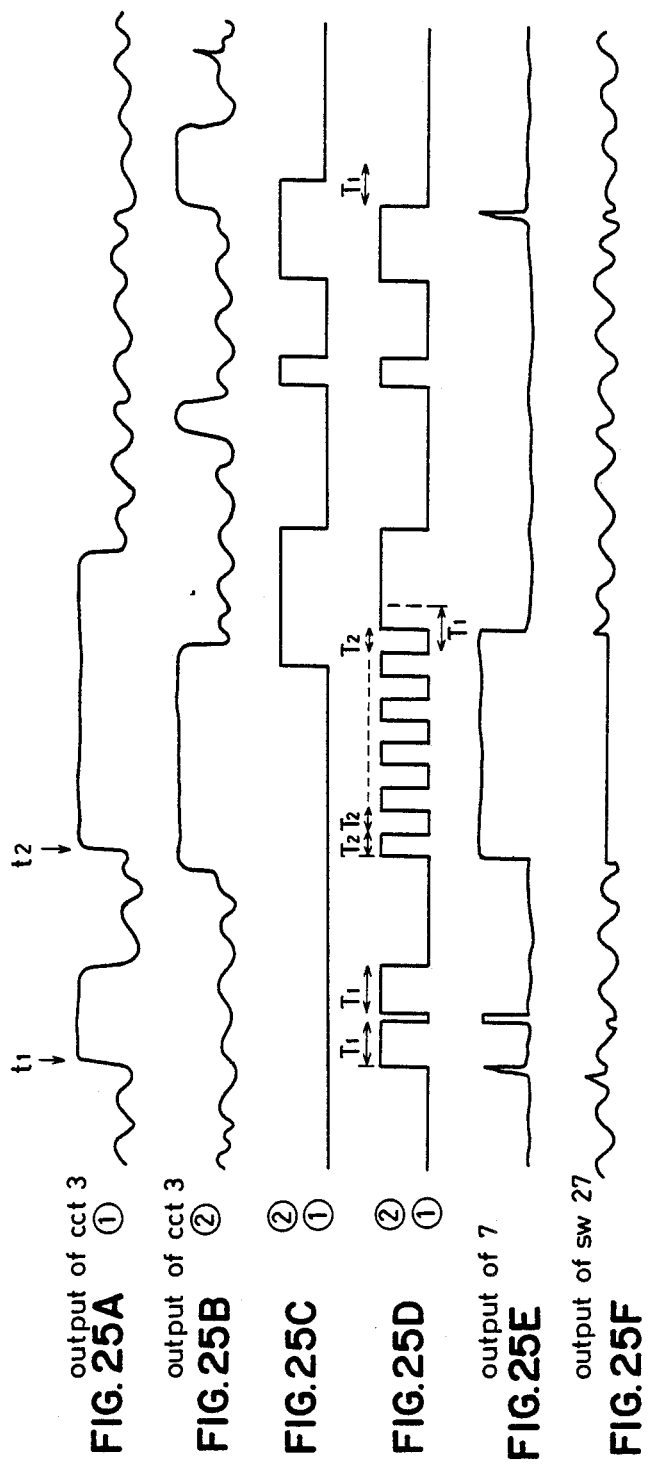

RADIO RECEIVER WITH RECEPTION DETERIORATION COMPENSATION

TECHNICAL FIELD

This invention is applicable to mobile radio communications. This invention is applicable to reduction of interferences and noises in a receiver of radio signals which have been modulated in angle. More particularly, this invention is related to a technology which reduces noise otherwise caused by interference from adjacent channels in a mobile radio communication system with interleaved channels which attempts to increase the efficiency in spectrum utilization by allowing overlap of radio frequency spectra.

PRIOR ART

In mobile radio communication systems of FM, PM or other angle modulation systems, there are made attempts to minimize the frequency bandwidth occupied by one channel and maximize the number of channels usable in a given bandwidth to increase the efficiency in spectrum utilization. For this purpose, the technology to limit instantaneous frequency deviation within a predetermined scope in signal transmission is widely used.

FIG. 1 is a diagram to show an embodiment of a signal transmission system structure of PM modulation wherein signals inputted at a terminal 101 are differentiated by a differentiator 102, limited in envelope by a limiter 103 within a predetermined scope of values, and then outputted from an antenna 106 via an FM modulator 104, and a transmitter 105.

In the receiving system, the signals are inputted through an antenna 107, passed to a receiver 108, detected in frequency by a frequency discriminator 109 and demodulated to FM demodulated signals, integrated by an integrator 110, and then outputted from an output terminal 111. The modulated signal output can be maintained within a predetermined scope of maximum frequency deviation as the signals are modulated by the FM modulator 104 after they have been passed through the limiter 103.

When interleaved channel arrangement is used to increase the spectrum utilization efficiency further, channels are arranged at a smaller frequency interval to allow overlapping of spectra between adjacent channels. FIGS. 2(a)-(c) is a chart to show demodulated output when interference occurs in adjacent channels. In FIG. 2(a), the solid line denotes fluctuation caused by fading entailed by the changes in the level of desired signals, while the broken line denotes fluctuation in levels of interfering signals from adjacent channels after they have passed through an IF filter in a receiver. The horizontal axis expresses time. As is obvious from FIG. 2(a), there is a short time period when the level of undesired interfering signals is higher than that of desired signals. During this period undesired signals are demodulated by the capture effect in FM to appear in demodulated output. FM demodulated signals jumps in frequency during this period by the frequency equivalent to the frequency difference between adjacent channels to output the demodulated waveform shown in FIG. 2(b). The graph represents the envelope of demodulated signals in vertical axis to indicate that the envelope corresponds to the frequency deviation before demodulation. The horizontal axis is the time axis with the same scale as FIG. 2(a). FIG. 2(b) represents the signal waveform of the FM demodulated signals after they have passed through a low-pass filter, but for simplicity's sake, beat noise caused by interference is eliminated from the graph.

Moreover, when interfering signals are modulated, the envelope thereof varies in accordance with the attenuation performance of an IF filter after the signals have passed the filter. When the level of interfering signals is high, the level of desired signals sometimes alternate with that of undesired signals at a pitch close to that of modulating signals in the undesired signals. In order to describe such a phenomenon, a part of FIG. 2(b) is enlarged in FIG. 2(c).

The amplitude of waveform shown in FIG. 2(c) corresponds to the frequency difference between adjacent channels, and more than twice of the maximum frequency deviation in modulated signals in conventional systems to cause noise of extremely large amplitude or energy level. Especially in speech communication systems using phase modulation, such waveforms are integrated to further emphasize the low frequency component thereof, producing quite jarring uncomfortable noises. The noises caused by the alternation between the level of desired signals and that of undesired signals due to the modulation of interfering signals becomes intelligible crosstalk which greatly affect the speech quality.

As described above, the conventional systems are defective in that when adjacent channels interfer each other in signal levels in the arrangement of interleaved channels, even if the interfering signals are attenuated by an IF filter in a receiver, large noises proportional to the frequency difference between channels occur to thereby drastically deteriorate the signal-to interference noise ratio performance of demodualated signals.

One of the effective technologies to improve the receiver performance is called diversity reception. According to the technology, plural reception systems or diversity branches are provided so as to select signals of one of the branches or to synthesize plural signals for output from the system. In one of the well known technologies, received signal envelope levels of the plural systems are evaluated to select the output from the system having the higher envelope level. When the interferertce like above occurs between adjacent channels in such a receiver, however, the branch having a higher level of adjacent channel is sometimes selected. The diversity technology is therefore not entirely free of the problems.

This invention aims to obviate such problems encountered in the prior art, and to provide a signal transmission system which minimizes the effect of interference from adjacent channels in the interleaved channel arrangement and the noise which tends to occur under such a condition.

DISCUSSION OF THE INVENTION

This invention is characterized in that it comprises a circuit which detects deterioration in reception performance caused by interference from adjacent channels in a radio receiver of the type which transmits angle-modulated signals by limiting frequency deviation within a predetermined scope. The detection circuit detects a state where interference signals dominate over the desired signals due to fading while the desired signals are being received. More specifically, the circuit monitors the envelope of FM demodulated signals and detects the time when it increases beyond a threshold. In other words, as the envelope of FM demodulated signals corresponds to the deviation in received frequency, when the amplitude of the FM demodulated signals goes up beyond a predetermined threshold, the deviation of the received frequency is judged to have surpassed a predetermined value.

This invention is further characterized in that received signals are processed by detection output from the circuit which detects the deterioration in reception performance. The simplest method to process such received signals is to disconnect the output path of the received signals. In other words, when a deteriorated performance in reception of signals is detected and the undesired signals from the adjacent channels are detected to dominate over desired signals, the output path of the received signals is disconnected during the time so as not to deliver the noise.

Another method to process received signals is to attenuate signals while such deteriorated performance is being detected. The received signals may be attenuated at two levels or the attenuation may vary in multi-stages, or continuously depending on the frequency of the detection of such performance.

Still another method is to limit the envelope of received signals while such deteriorated reception performance is being detected. The envelope may be limited similarly in two-stages, multi-stages or continuously.

Still another method is to disconnect the signals while the deteriorated performance is being detected, and at the same time to interpolate the signal which was blocked off from the signal one signal previous to the blocked signal. There have been proposed various methods for interpolation such as repeating waveform of the signal immediately before. Many methods are known for interpolation depending on whether received signals are speech signals or digital signals.

The signal processing timing may be optimized by giving a delay to received signals in aforementioned method. The noise may be removed more effectively by this operation. When a delay is given to received signals, signals received at the timing from slightly before the deterioration until those at the timing after such deteriorated performance disappears may be processed by disconnection or interpolation for the output of delayed signals. Noise mixed in the received signals may be removed more effectively by such a processing.

There is proposed still another method to process received signals when these signals are digital signals, which correct errors in the digital signals received during the detection of such deteriorated performance. More particularly, when occurrence of errors can be detected from parity or redundancy bits in the digital signals, the method detects deterioration in reception performance to find bits of higher error probability, and inverting such highly probable bits to correct errors.

The output from the circuit which detects occurrence of deteriorated reception performance due to the interference from the adjacent channels can be applied to diversity control. More specifically, in a diversity receiver with plural receiver systems wherein one of the outputs from a system may be selected or emphasized while others may be attenuated before synthesizing them, switching of such plural receiver systems can be carried out with the detection output of the deteriorated performance according to this invention. According to this invention, when signals of high level are outputted as received signals due to the interference by adjacent channels, the high level signals are prevented from being selected so that noise of high level is not delivered as output. When detection output according to this invention is used in the diversity control, it is preferable to use this invention control in parallel to the conventional selection control by received signal level so as to compensate defects of the systems each other.

Threshold may be set at a predetermined value in advance for detection of receiver conditions. It has been experimentally proven, however, that if such a threshold is varied depending on the reception conditions, that is effective in reduction of noise.

A full-wave rectifier may be used to detect the envelope of FM demodulated signals for detection of deterioration in reception performance, which enables detection of interference from one circuit for both adjacent channels, i.e. the channels of lower and higher frequency levels. There are several available circuit which can detect the amplitude of such FM demodulated signals with inherent merits and demerits. If some of those circuits are combined in use, they would be most advantageous.

When the transmitted signals are angle-modulated signals, it is preferable to branch out the outputs from the FM demodulation circuit which demodulates received signals in order to use them as input signals of the detector. Alternatively, it there is no FM demodulation circuit in the signal demodulation system, a dedicated FM demodulation circuit may be separately provided for detection of reception conditions.

This invention may be applied to the cases where transmitted signals are not angle-modulated signals. An example thereof is multi-level modulation (e.g. 16QAM) which is a mixed mode of amplitude-modulation and angle-modulation. Although this invention is well applicable to authentic amplitude-modulation systems, the effect would be less remarkable because interference noise in such a system can be removed simply by providing a low-pass filter or a band-pass filter of a narrow bandwidth in the path of demodulated signals or in the path of IF signals.

This invention will now be described in detail in referring to preferred embodiments shown in the attached drawings.

BRIEF DESCRIPTION OF DRAWINGS

FIGS. 5(i)–(vi) shows graphs to explain the operation at deteriorated reception performance.

FIGS. 7(i)–(iii) show waveforms of signals which explain removal of interference by the embodiment.

FIG. 8(i) and (ii) shows the attenuation in relation to detected amount in deteriorated reception performance.

FIGS. 9(a) and 9(b) shows operation charts of the second embodi ment.

FIG. 12 is a diagram to show an embodiment of the threshold generator which can vary threshold level.

FIGS. 13(i) and 13(ii) are an explanatory waveforms of operation to vary detection threshold.

FIGS. 25(i)–(vi) are explanatory view to show an improvement in quality of demodulated signals according to this invention.

DETAILED DESCRIPTION OF PREFERRED EMBODIMENTS

Figure 3:
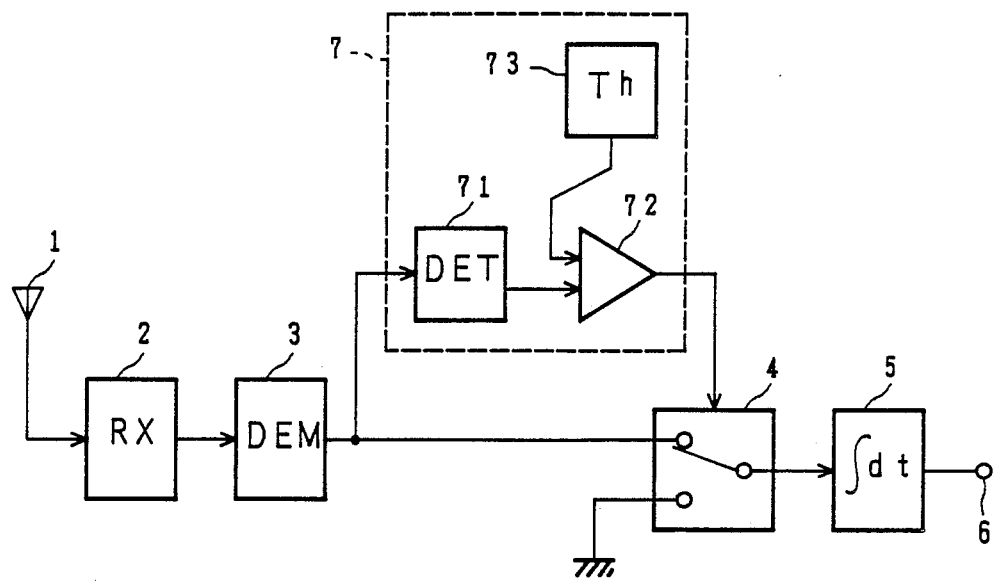
FIG. 3 is a block diagram of the first embodiment of this invention (in particular, fixed threshold to detect deteriorated reception performance, and disconnection of received signals).

FIG. 3 is a block diagram of the first embodiment of this invention wherein an antenna 1 is connected to a receiver 2, and output of the receiver 2 is connected to an FM demodulator 3. The output of the FM demodulator 3 is fed via switch 4, to an integration 5 and the output therefrom is directed to an output terminal 6. This embodiment is characterized in that a detection circuit 7 is provided at the output of the FM demodulator 3 for detecting of deterioration of reception performance so as to control with the output therefrom the switch 4 provided in the path of received signals.

Figure 4A:
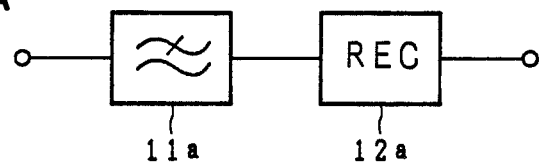
FIG. 4(a), 4(b) and 4(c) illustrate structure of envelope detection circuits.
Figure 4B:
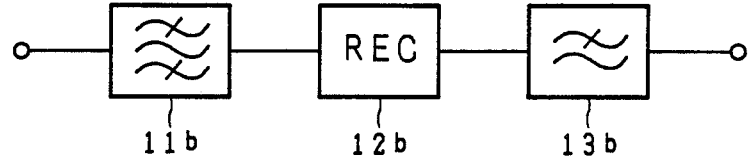
Figure 4C:
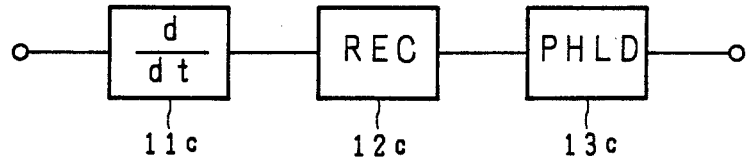

The detector 7 comprises an amplitude detector 71 which receives the signals branched out from output of the demodulator 3 and detects the amplitude of the FM demodulated signals. The delector further includes a comparator 72 which compares the output from the detector 71 with a threshold Th from a threshold generator 73. The amplitude detector 71 may have a structure as shown in FIG. 4(a) so as to feed the FM demodulated signals to a low-pass filter 11a, and feed the output therefrom to a full-wave rectifier 12a in order to detect the absolute value of the amplitude. FIGS. 4(b) and 4(c) show modifications of the amplitude detector 71 which are be described in more detail hereinafter.

Figure 1:
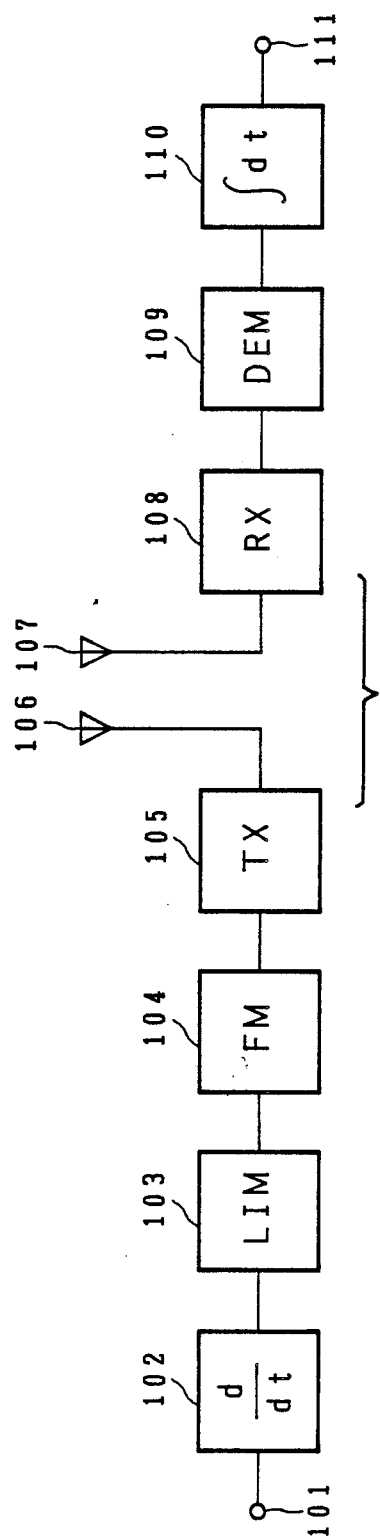
FIG. 1 is a chart to show the structure of signal transmission system in a phase-modulation system.
Figure 2:
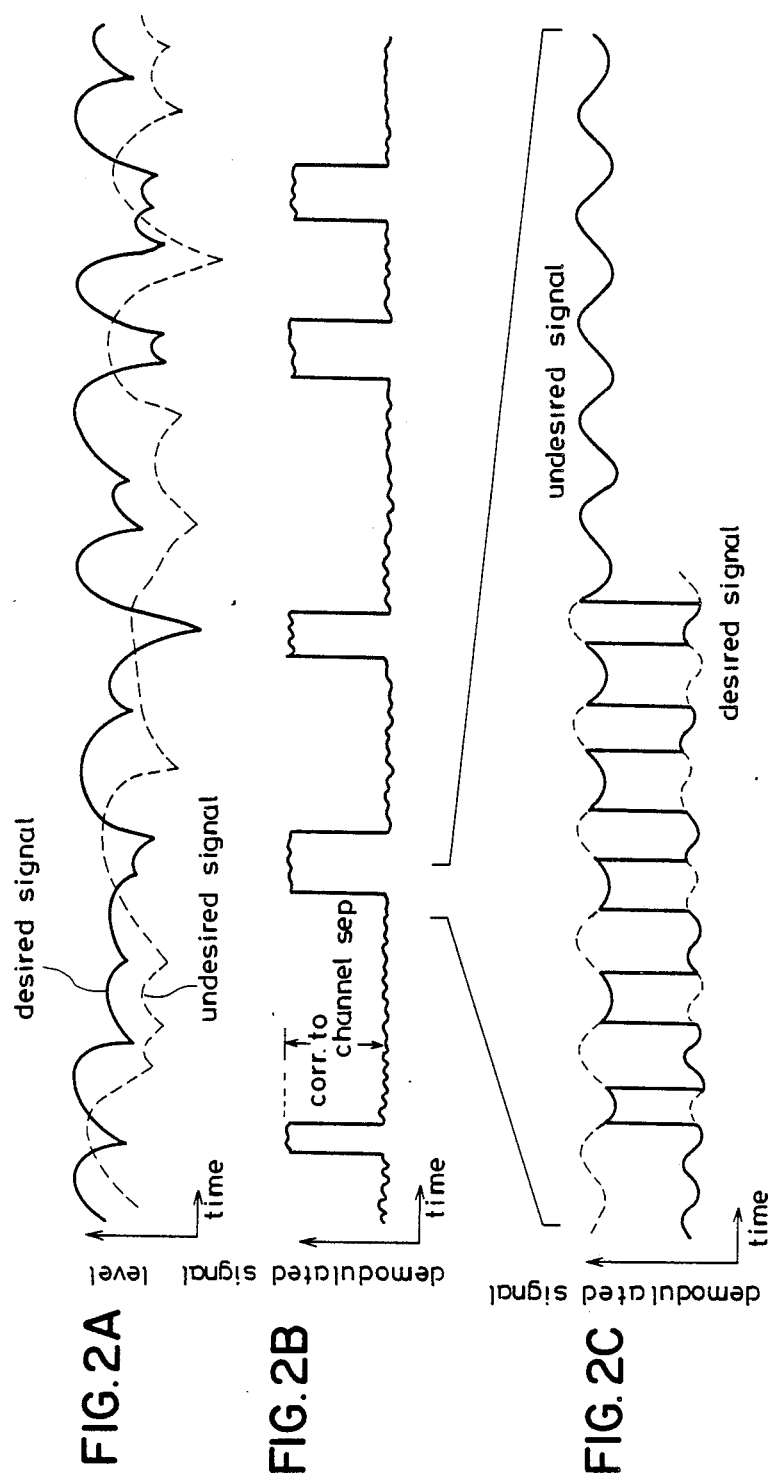
FIG. 2a, 2(b) and 2(c) are examplary explanatory waveform of frequency detection output when interference occurs between adjacent channels in an interleaved channel arrangement.

Graphs in FIG. 5(i)–(ii) describe the operation of a deteriorated performance detector 7. When signals interfere between adjacent channels, jump phenomenon is produced in the envelope of the FM demodulated signals as shown by the letters A, B, C and D in FIG. 5(i). More particularly, as above described in relation to FIG. 2(a)–(c), frequency jump is produced by alternation of desired waves with undesired waves while beat occurs due to interference. The jumps shown by the letters A through C in FIG. 5(i) are caused by the interference from the upper side channel while those shown by the letter D is caused by the interference from the lower side channel. After having passed the low-pass filter 11a shown in FIG. 4(a), heat components of the signal are removed to assume the waveforms shown in FIG. 5(ii). The output shown in FIG. 5(iii) is obtained by passing the above signals through a full-wave rectifier 12a. When the comparator 72 detects that the output increases beyond a threshold Th, it judges that there is interference to output signals antenna 105 in FIG. 5(iv) and develops the signals in FIG. which are applied from the detector 7. As the period when the signal in FIG. 5(iv) is raised indicates interference, the switch 4 is turned off to disconnect the received signals. This operation prevents output of noise at high level to eliminate jarring noise.

The Radio Law provides that the frequency deviation should be limited at a specific value or less on the transmitter side of a mobile radio communication system with analogue FM by an IDC circuit in order to prevent interference with other channels. Therefore, the threshold is preferably set at a level which can judge deviation higher than the regulated value as the interference.

FIGS. 4(b) and 4(c) show modifications of the detector 71. FIG. 4(b) shows a detector which feeds FM demodulated signals to a band-pass filter 11b and detects the power level thereof. When the waveforms shown in FIG. 5(i) are passed through a band-pass filter 11b, the beat shown in FIG. 5(v) is outputted. In other words, the beat frequency corresponds to the difference between the desired and undesired signals in frequency. For instance, if the channel interval is assumed to be 8 kHz, the beat will have the frequency around 8 kHz. The beat is fed to the full-wave rectifier 12b and smoothed by a low-pass filter 13b to output the beat power as shown in FIG. 5(vi). The deterioration in performance could be detected by an increase of the power beyond the threshold. The circuit of FIG. 4b, however, may be valid only when the duration of time at which the undesired signal dominates the desired signal is small enough. This is because the beat will not be in the demodulated signals in the midst of the duration, at which the undesired signal is much higher than the desired signal.

The circuit shown in FIG. 4(c) is a detector which detects time the derivative value of FM demodulated signals in the absolute values. As shown in FIG. 5(i), where interference occurs at A, B, C and D, FM demodulated signals drastically change to vary the amplitude chronologically. The FM demodulated signals are differentiated in time by the differentiator 11c, and its amplitude is obtained in absolute value by the full-wave rectifier 12c. The amplitude is temporarily held by a peak holding circuit 13c, and if the output therefrom increases beyond a threshold, the reception performance is judged deteriorated. The circuits shown in FIG. 4(b) or 4(c) is the circuit having better characteristics in utility than that shown in FIG. 4(a).

Figure 6:
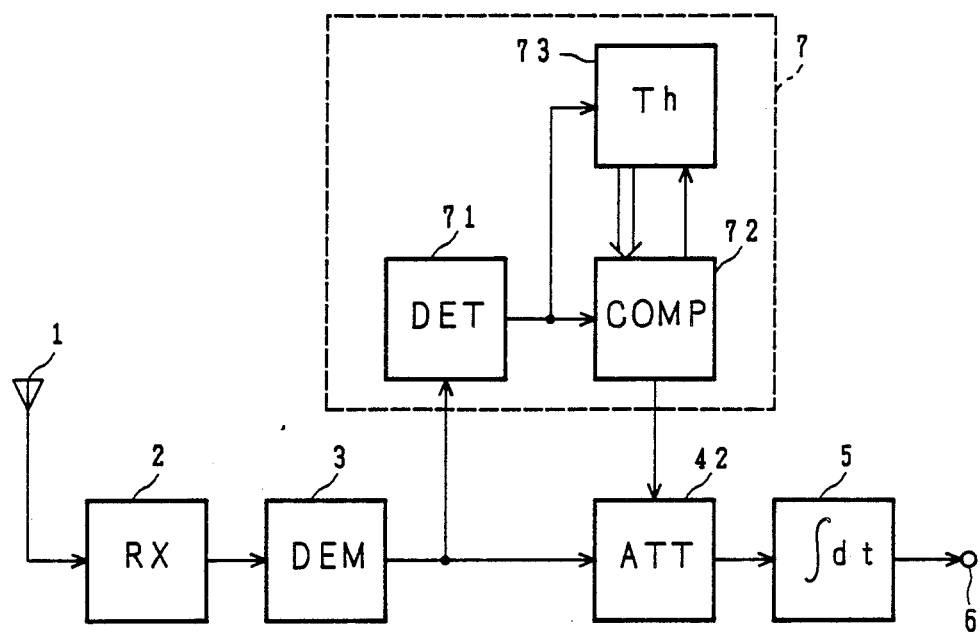
FIG. 6 is a block diagram to show the second embodiment according to this invention (in particular, variable threshold and received signal attenuation).

FIG. 6 is a block diagram showing a second embodiment of this invention. Compared to the first embodiment, the second embodiment is characterized in that a variable attenuator 42 is provided in the path of the signals received from in the FM demodulator 3 instead of a switch, and an additional circuit is provided to vary the threshold Th for detecting the reception performance depending on the received signals. More particularly, the variable attenuator 42 is inserted in the output of the FM demodulator 3, and the attenuation level is controlled by the output from the detector 7. The threshold generator 73 of the detector 7 is adapted to change the threshold depending on the output from the amplitude detector 71. Other structure is basically the same as the structure of the first embodiment, and description is omitted to avoid redundancy.

By providing a variable attenuator 42 in place of a switch on the path of the received signals, it becomes more convenient as the receiver output does not become mute but is lowered so as low as not to cause discomfort to the ears. Noises can be removed more effectively by setting a threshold Th variably in an optimal way to detect deterioration in performance. In the embodiment shown in FIG. 6, the threshold generator 73 and the comparator 72 comprise microprocessors. The threshold generator 73 counts number of times that the output signals are higher than a predetermined threshold value Th, and when the counted value exceeds that predetermined value, the threshold given to the comparator 72 is towered to a threshold Th' which is smaller than the above mentioned threshold Th. This structure can effectively remove noises as is explained below referring to FIG. 7(i)–(iii).

In FIGS. 7(i), the output signals from the FM demodulator 3 are marked with solid lines. Large noises are produced at times denoted by the letters A through F due to the interference from adjacent channels. Unless suitably removed, all of these noises will be outputted to greatly affect and deteriorate the speech quality. FIG. 7(ii) shows an application of this invention to such a case when the absolute value of FM demodulated signal increases beyond a predetermined threshold Th, a large attenuation is generated by the variable attenuator 42 so as to lower the level of the signals passing therethrough. This can remove large noises to a certain extent. However, due to the operating range limitation, the bandwidth limit and influence of thermal noises, frequency jumps do not always reach the level of threshold Th such as those shown by the letters C, E and F in FIG. 7(i). Even if they reach the level, it might take longer to reach the threshold level. In other words, in such a case, noise cannot be removed completely but remains as shown in FIG. 7(ii). In order to remove the noises fully, the threshold should be set at a low enough value, but if it is set at too low a value, modulated signals of desired signals would be disconnected to distort signals and deteriorate speech quality even when there is no interference from adjacent channels.

FIG. 7(iii) shows an operation when the threshold Th is varied to a smaller threshold Th' depending on the conditions. For instance, when interference occurs from an adjacent channel, and FM demodulated signals frequently go beyond the threshold Th, the threshold Th is changed to the threshold Th'. This removes practically all the noise showin in the right side of FIG. 7(iii). Conversely, when the receiver condition is excellent substantially without interference, a higher threshold Th may be set and no demodulator output of desired signals is cut off. Under a condition where interference frequently occurs, even if the threshold is set low, modulated signals may be prevented. But even if it increases distortion, removal of interference noise will improve quality more remarkably to achieve an excellent speech quality.

The method to vary the threshold is not limited to the above, but may be added with other factors such as fading pitch or change of desired signals to achieve higher effect. Alternatively, the threshold is varied periodically irrespective of the reception conditions. The levels of threshold are not limited to two, i.e. a high level and a low level, but may be three or more or can be varied continuously.

When data is transmitted with tone signals instead of speech signals, it is preferable to switch thresholds automatically or manually from the ordinary analogue speech transmission type to a threshold of different type. If signals are cut with a threshold smaller than the maximum frequency deviation in MODEM signals, signals would not be transmitted correctly because of waveform distortion Therefore, for the MODEM signals, the threshold level should not be lower than the maximum frequency deviation.

The operation to attenuate received signals by means of a variable attenuator 42 instead of a mere disconnection by means of a switch and the relation thereof with threshold change will be described below.

FIGS. 8(i) and 8(ii) are graphs showing control characteristics of the variable attenuator 42 of detector 7. The degree of deterioration in reception performance detected by the detector 7 is plotted on the horizontal axis while responsive attenuation by the attenuator 42 is plotted on the vertical axis. In FIG. 8(i), three values are set as thresholds, and when the degree of deterioration in performance reaches the thresholds Tha, Thb and Thc respectively, the attenuation by the attenuator 42 is controlled to reach infinity to block the passage of the signals. Depending on the reception conditions, one threshold is selected out of three to present different control characteristics. FIG. 8(ii) shows a case where attenuation changes gradually depending on the degree of deterioration in reception performance. Three types of control charactereistics A, B and C are prepared in advance so that one out of three is selected for use. There is used no concept of threshold in the case shown in FIG. 8(ii). When attenuation is varied continuously as in the case shown in FIG. 8(ii), the circuit structure becomes complicated, but it can adjust attenuation depending on the degree of deterioration in performance to minimize the information lost by attenuation.

FIG. 9 shows another method to control the variable attenuator 42 depending on the output from the detector 7. The method uses both the circuit in FIGS. 4(a) and (b) as the amplitude detector 71, and it offers better performance. The solid line in FIG. 9(a) shows an FM demodulator output, and the dotted line is the beat power level. Th1 is the threshold of the detection circuit of FIG. 4(a), Th2 is that of the circuit of FIG. 4(b). A case where the characteristics of an attenuator 42 are those shown in Fig. 8(i) is taken for an example.

As shown in FIG. 5(ii), the circuit of FIG. 4(a) is effective to detect the interference or undesired signal which becomes to dominate over the desired signal. However, it cannot detect the state immediately preceding the change. It is also defective in that it unavoidably outputs a detection output when it detects clicking noise due to cochannel interference. The circuit of FIG. 4(b), on the other hand, can detect interference before it becomes dominant over the desired signal, as shown in FIG. 5(v). But after the interference dominates, the detection output becomes small. As shown in FIG. 9, therefore, when attenuation is controlled by both circuits shown in FIGS. 4(a) and 4(b), attenuation can be obtained even before the reversal of dominance and attenuation is secured at the time of reversal. The threshold Th1 and the threshold Th2 are set separately and respectively for the circuit in FIG. 4(a) and the one in FIG. 4(b). Thus, the method of FIG. 9 can reduce residual noises.

Figure 10:
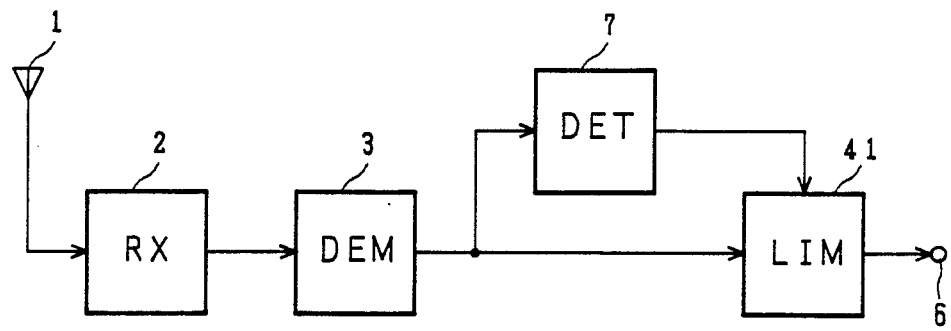
FIG. 10 is a block diagram of the third embodiment of this invention (fixed detection threshold and limitation of received signal envelopes).

FIG. 10 is a block diagram of the third embodiment of this invention. In this embodiment, an amplitude limiter 41 is inserted in the output signal path of the FM demodulator 3, and the limiting level of the limiter 41 is controlled by the output from the deteriorated performance detector 7. More particularly, when the reception is detected to have deteriorated the limiting level of the amplitude limiter 41 is lowered so as to suppress the level of the noises passing therethrough. In this embodiment, several threshold levels may be set, and the limiting level can be changed depending on the degree of the deterioration so that noise otherwise caused by interference can be reduced to improve the speech quality. The third embodiment is most effective when applied to FM transmission.

Figure 11:
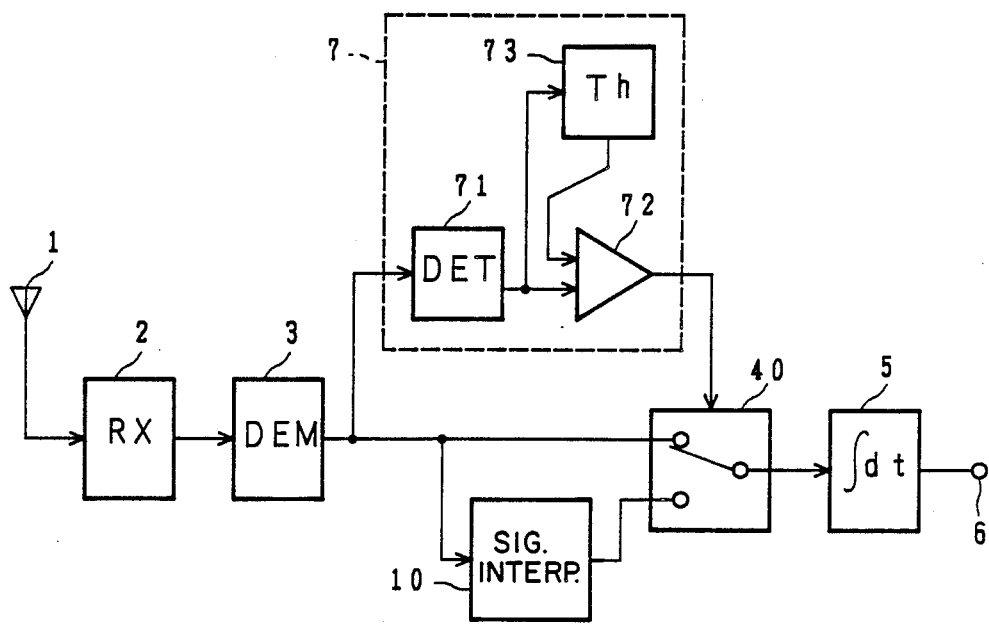
FIG. 11 is a block diagram of the fourth embodiment of this invention (variable threshold and interpolation of received signals).

FIG. 11 is a block diagram of the fourth embodiment of this invention. The threshold in this embodiment may be shifted between two levels, and a switch circuit 40 inserted in the path of the signals from the FM demodulator 3 is used not merely to disconnect the signals but also to connect the path with the output from a signal interpolation circuit 10 while the signals are blocked so as to interpolate the signals lost by disconnection.

The first embodiment of the signal interpolation circuit 10 continues the waveform immediately preceding. Vowels are generally known as the repetition of certain waveforms. Therefore, the vowel portion in a speech can be fairly faithfully restored by continuing the waveform of the signal immediately before the disconnection. The second embodiment interpolation circuit 10 can carry out more sophisticated interpolation by reproducing the waveform of one pitch immediately before the shifting of the switch 40 in a pitch aligned with interpolated portion. Such technology is described in detail in the paper entitled Time Diversity by Pitch-Synchronized Interpolation: IEEE Transaction Vehicular Technology VT-29 No. 4, 1980. It was proven that this technology can restore the data, which was once lost, due to the redundancy of speech to thereby remarkably improve the quality.

FIG. 12 is a structural view to show a simply constructed threshold generator 73 wherein one of the inputs of the comparator is fed with a predetermined threshold $Th_1$ while the other input is fed with the output from the amplitude detector 71. The comparator 74 is connected to a multi-vibrator 75 and generates output when the output from the detector 71 exceeds the threshold $Th_1$. When the output from the detector 71 has become lower than the threshold $Th_1$, and a predetermined time T has elapsed, the output from the multi-vibrator 75 is suspended. One of the two levels of the threshold can be selected in supply to the comparator 72 by switching the switch 76 between the tw thresholds of the higher one $Th_1$ and the lower one $Th_2$ in accordance with the output from the multi-vibrator 75.

FIG. 13(i) explains the operation to set a threshold by the circuit. The switch 76 switches between the higher threshold $Th_1$ and the lower threshold $Th_2$ for output. FIG. 13(ii) shows the waveforms after the FM demodulated signals have passed through the switch 40. In the figures, the broken lines express the wave forms when the threshold $Th_1$ is fixed wherein noise remains as the detected value is lower than the level $Th_1$. FIG. 13(i) shows that these noises are almost removed when the threshold level is shifted. This embodiment is advantageous in that it can be constructed with simple circuits and is highly adaptive to various conditions as the threshold therein is variable by switching.

Figure 14:
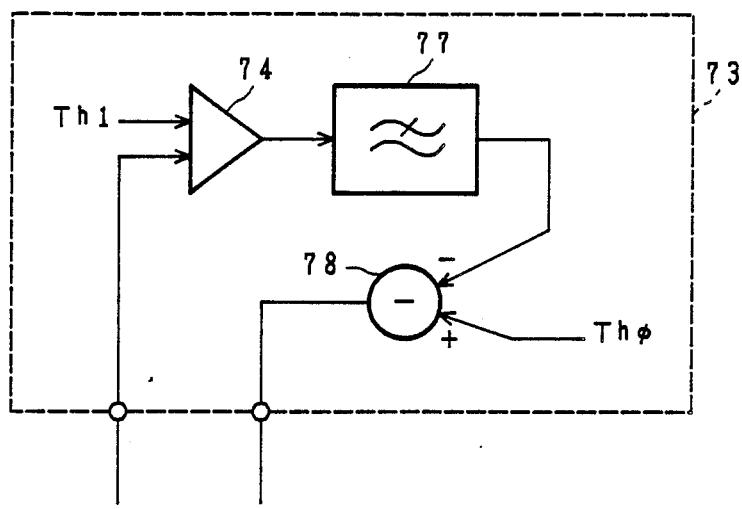
FIG. 14. is a block diagram to show another embodiment of the threshold generator which can vary detection threshold.
Figure 15A:
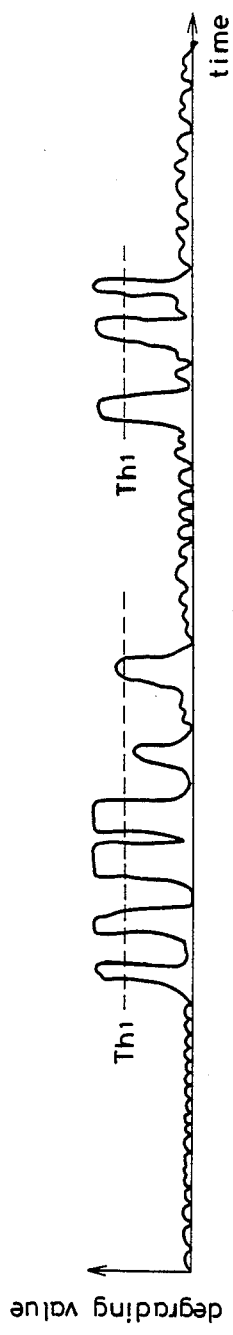
FIGS. 15(i)–(iv) are an explanatory view of the operation to vary detection threshold.
Figure 15B:
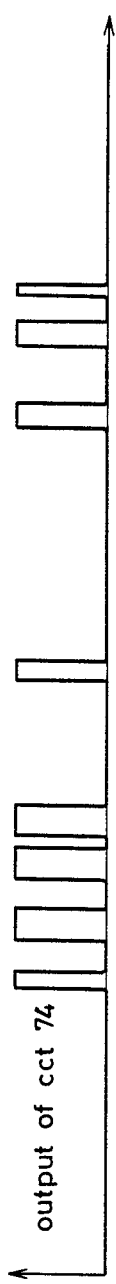
Figure 15C:
Figure 15D:
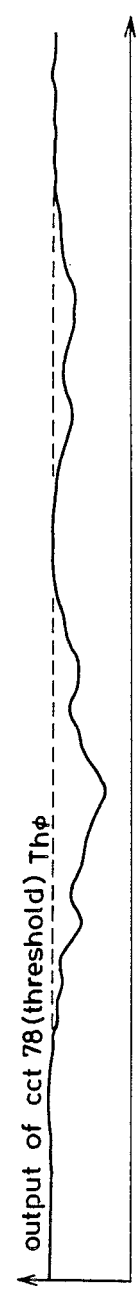

FIG. 14 is an explanatory view to show still another embodiment of the threshold generator 73. In this embodiment the output from the comparator 74 is passed through a low-pass filter 77, and the output therefrom is subtracted from the predetermined threshold $Th_\theta$ by a subtractor 78. FIGS. 15(i)–(iv) shown explanatory views of the operation to set the threshold by this circuit. FIG. 15(i) shows the output from the amplitude detector while FIG. 15(ii) shows the signals from comparator 74 which compares the output from the detector with the threshold $Th_1$. FIG. 15(iii) shows the signals which have passed through low-pass filter 77. The signals are substrated from the reference value $Th_\theta$ to obtain the threshold output shown in FIG. 15(iv). Thus the threshold can be lowered when the deterioration in reception performance is large in average, and noise can effectively be removed.

Figure 16:
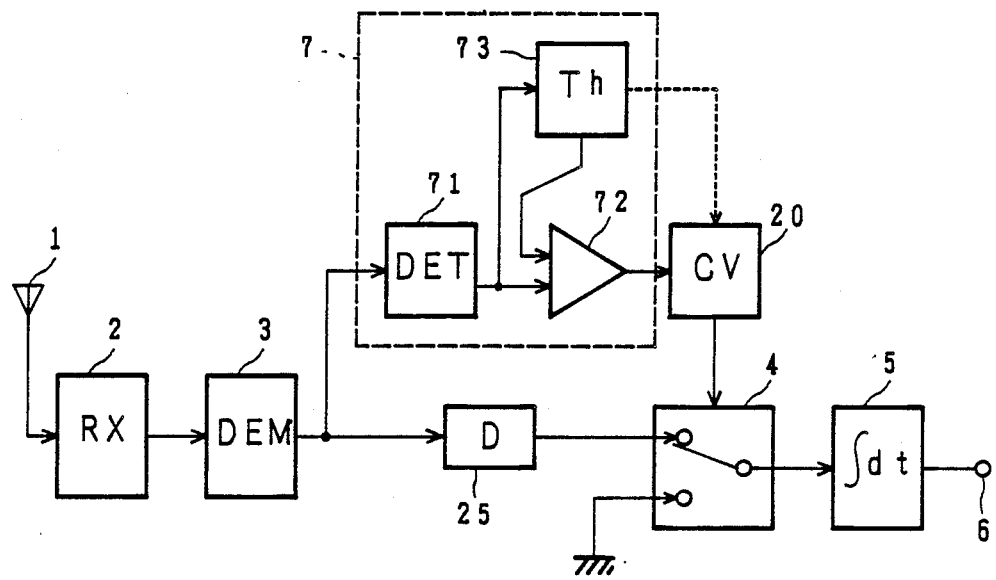
FIG. 16 is a block diagram of the fifth embodiment of this invention (variable detection threshold, disconnection of received signals and received signal delay).
Figure 17:
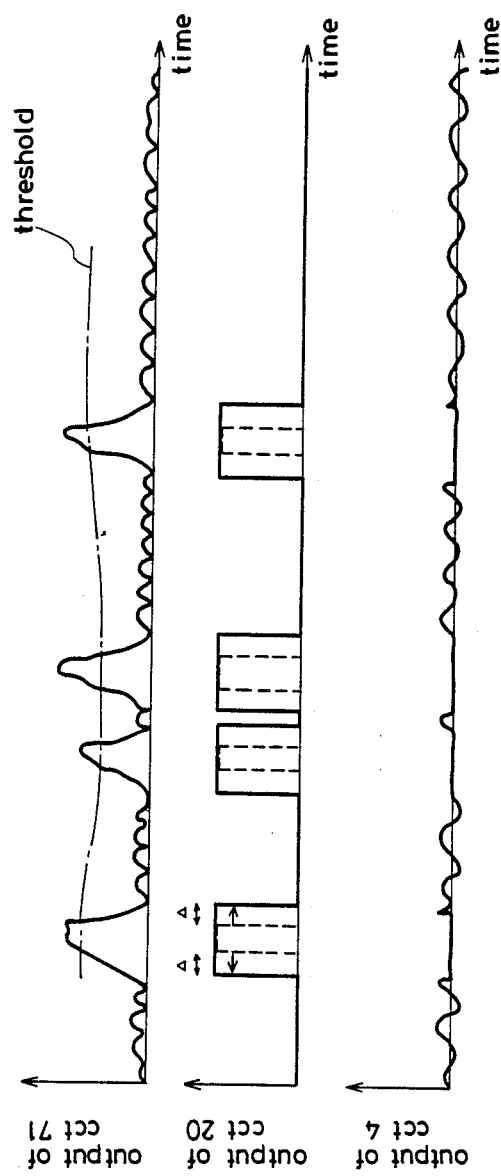
FIGS. 17(i)–(iii) are explanatory view of the fifth embodiment.

FIG. 16 is a block diagram of the fifth embodiment of this invention wherein a delay circuit 25 is inserted in the output signal path of the FM demodulator 3, the detector 7 has a variable threshold, and a switch 4 disconnects signals without interpolation. In the embodiment shown in FIG. 16 a delay is given to the FM demodulated signals, and the pulse width of the detector 71 output is extended by a pulse width transformer 20. FIG. 17(i)–(iii) explain the operation thereof. FIG. 17i shows the output waveform from the amplitude detector 71, FIG. 17(ii) the output waveform from the pulse width transformer 20, and FIG. 17(iii) the output waveform from the switch 4. In this structure, the timing to cut off the signals with the switch 4 is relatively fast on the time axis of the FM demodulated signals, and the time duration of such disconnection is extended. This enables the noises caused by the interference from adjacent channels to be removed at an appropriate timing over a broader scope.

In FIG. 17(ii), the broken line represents inputs to the switch 4 that will appear it otherwise circuit is used. The solid line represents the corresponding inputs to the switch for this embodiment. The pulse width is increased on both sides by $\Delta$ respectively that is caused by delay circuit 25 and pulse width transformer 20.

Further improvement is expected by adaptively controlling the changes in pulse width through the transformer 20, according to the degree of deterioration.

In this embodiment, the demodulated signals are first delayed, and then controlled by switching. This method, in general, is effective when the control is carried out on the basis of average deterioration over a given time. This is because it can adjust timing differences between control signals and demodulated signals to be controlled by it, even if the control signals are subjected to delay due to averaging process (e.g., in the embodiment shown in FIG. 14 a delay is caused by the low-pass filter).

Figure 18:
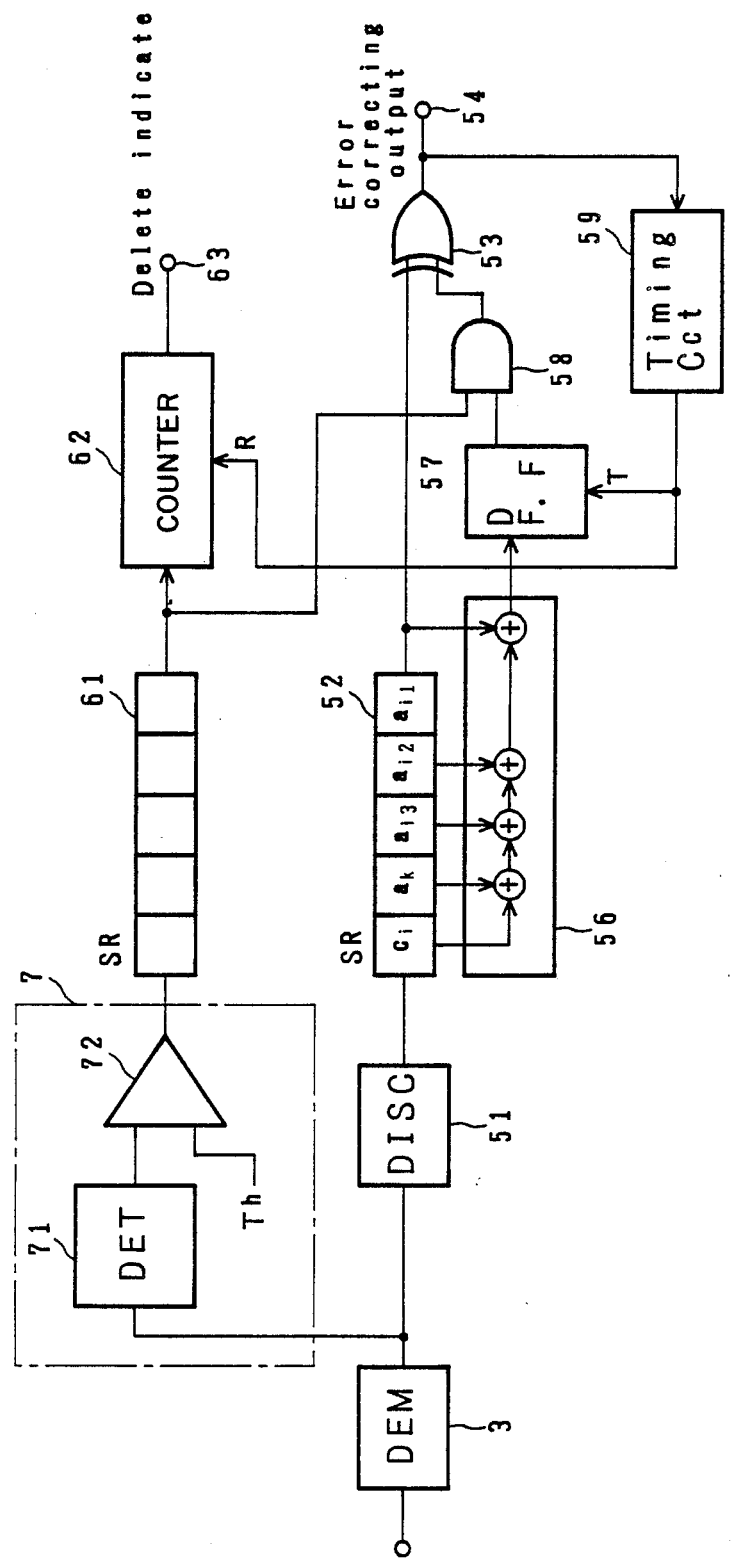
FIG. 18 is a block diagram of the sixth embodiment of this invention (digital signals, fixed detection threshold and error correction of received signals).

FIG. 18 is a block diagram to show the sixth embodiment of this invention when applied to digital signal transmission. This embodiment can correct errors in digital signals with the signal which detects the deterioration in reception performance.

In FIG. 18 the received signals are the signals which have been modulated in angle with digital signals, and demodulated signals are obtained at the output of the FM demodulator 3. The digital signals are constructed in the unit of a frame and each frame has an error detection code. The output from the FM demodulator is branched out so as to detect the presence/absence of interference from adjacent channels by the detector 7. This is similar to the one described in relation to FIG. 3. The output signals from the FM demodulator 3 are discriminated by a discriminator 51 and inputted successively at a shift register 52. The output read out in serial from the shift register 52 is transmitted to an output terminal 54 via an exclusive OR 53. The error detecting circuit 56 detects errors in the unit of a frame, and when an error is detected, a flip-flop 57 is set at a high level. The deterioration in reception performance is detected in synchronization with the digital signals in the unit of a bit. The result of the detection is inputted at a shift register 61 bit by bit. The serial output from the shift register 61 is synchronized with the reading out of the received signals from the shift register 52. When an error is detected in one frame of received signals, and the flip-flop 57 is set at the high level, the bit which is detected for deterioration by the shift register 61 is likely to have an error. Therefore, an output is transmitted for the bit to an AND circuit 58 so that the output from the shift register 52 for the bit is inverted for correction by the exclusive OR 53. A timing controller 59 detects frame synchronizing signals with the output signals from a terminal 54, and flip-flop 57 and counter 62 are reset with the detection output in the unit of a frame. Counter 62 is a circuit which counts the bits of performance deterioration sent to the output of the shift register 61, and when the number of counted bits is large (e.g. two or higher) in one frame, the data about the frame is judged not reliable, and a signal to dispose of the data of the frame, is transmitted to a terminal 63.

Figure 19A:
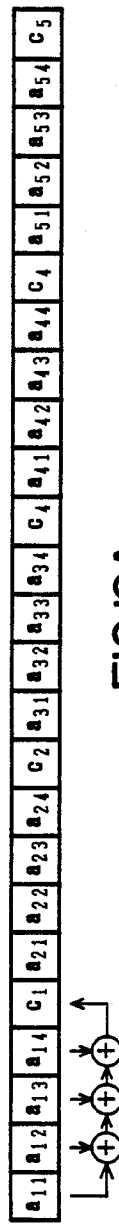
FIG. 19(a) and (b) are explanatory views of signal arrangement in the sixth embodiment of this invention.
Figure 19B:
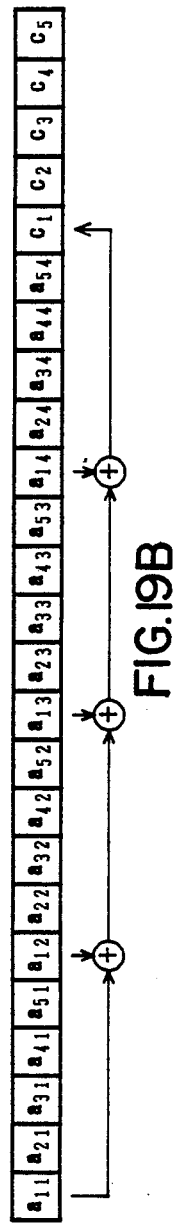

FIGS. 19(a) and 19(b) is a chart to show trains of coded digital signals used in this embodiment wherein axx indicates a data bit, and cx a corresponding check bit. In this embodiment, even parity check is used as the check bits. The case shown in FIG. 19(a) is the one where the units of error correction are concentrated timewise while the case of FIG. 19(b) is the one where the units of error correction is decentralized timewise. They are both well known code trains, but the one shown in FIG. 19(b) is more suitable to the transmission paths where errors are likely to occur for more than two successive bits.

This embodiment can detect whether error is in the frame or not by means of the error detection capability and can identify the bit(s) which most likely to have errors. As a result, it can enhance error correcting capabilities.

The concept can be applied to error correction over a still broader scope. For instance, if coding scheme that is capable of detecting N-bit errors but unable of error correction are used, errors on N bits can be corrected by this method.

Figure 20:
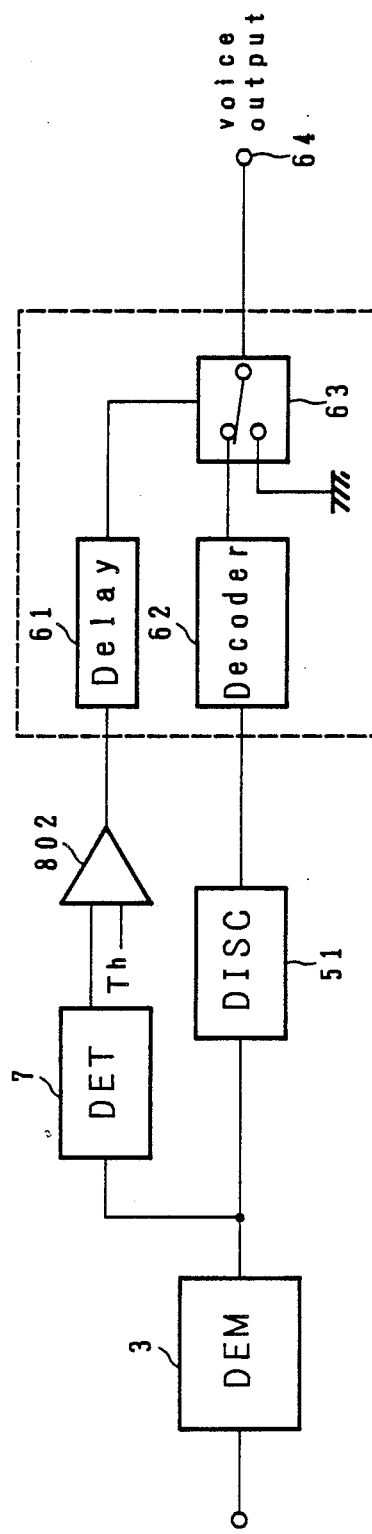
FIG. 20 is a block diagram of the seventh embodiment of this invention (digital speech signals, fixed detection threshold and disconnection of received signals).

FIG. 20 is a block diagram of the seventh embodiment of this invention which is applied to speech signals that have been digital-modulated. This embodiment is a system which converts speech into digital signals for radio transmission, and the digital signals obtained at the output of the FM demodulator 3 are discriminated by a discriminator 51 and inputted at a speech decoder 62. The digital signals are decoded by the speech decoder 62. The signals which have detected deterioration in reception performance are delayed by the delay circuit 61 by the time required for the discriminator 51 and the speech decoder 62. The output signals from the decoder 62 are transmitted to an output terminal 64. The switch 63 is usually connected to a contact on the upper side, but when an output is transmitted from the delay circuit 61, the terminal 64 is grounded to make the output at the terminal 64 mute. Even if large noises are generated by interference and transmitted to the output at the decoder 62, this construction can block out the noises to secure speech signals with a high legibility and quality. The part marked with broken lines in FIG. 20 may be realized by signal processing of the speech decoder, and error correction method shown in FIG. 18 may be used in parallel to the above in the processing. A further improvement can be achieved if the circuit is adapted to make the decision for mute period with the bit which detects interference from adjacent channels within a unit of correction (i.e. delete indicate 63 in FIG. 18).

An application of this invention to a diversity receiver will now be described.

Figure 21:
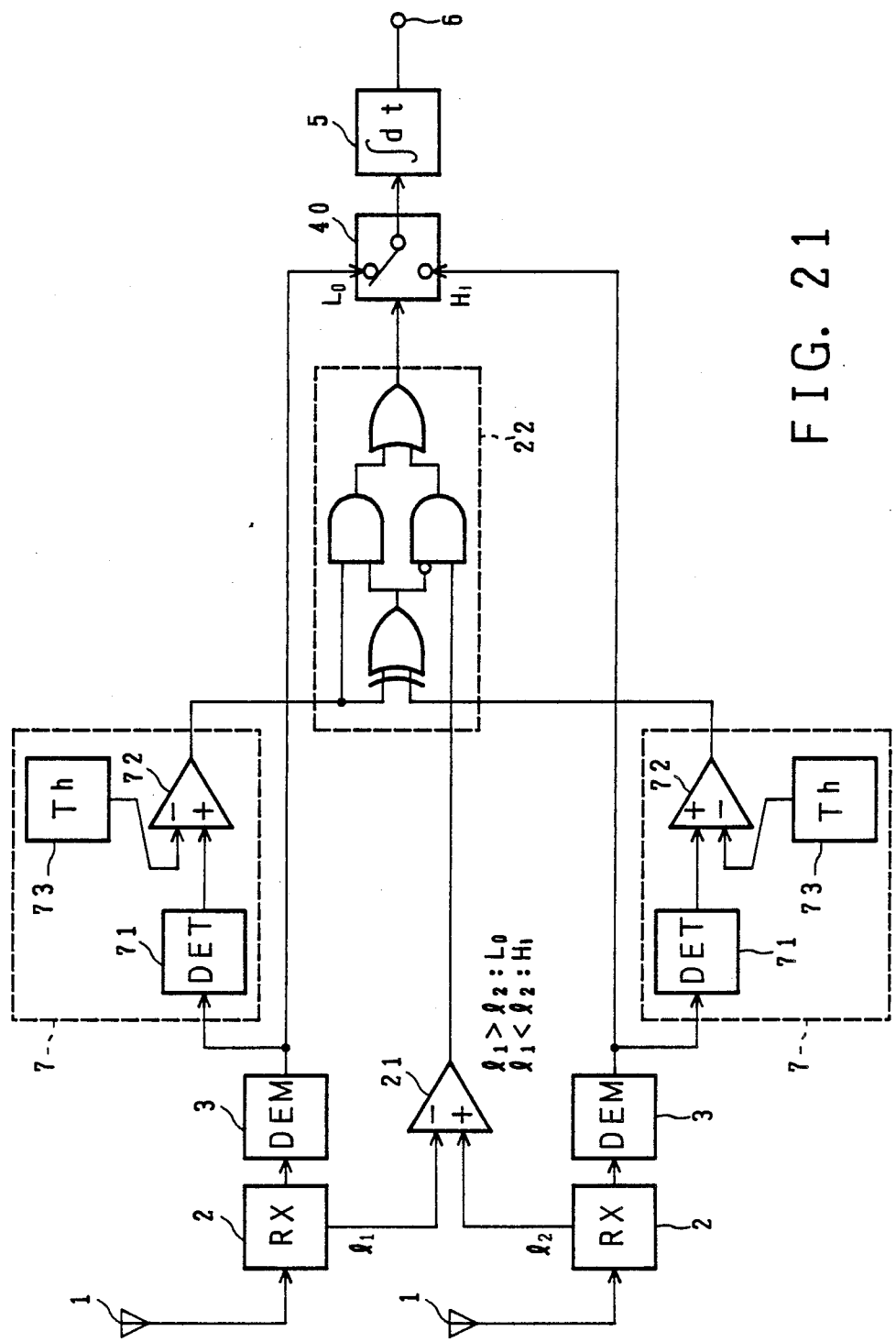
FIG. 21 is a block diagram of the eighth embodiment of this invention (diversity system).

FIG. 21 is a block diagram of the eighth embodiment of this invention applied to a diversity receiver. In this diversity method, judgement of whether or not the detected deterioration in reception performance exceeds a threshold is used for diversity branch selection algorithm.

In FIG. 21, there are provided two receiver systems each of which comprise an antenna 1, a receiver circuit 2, an FM demodulator 3 and a detector for deteriorated reception performance 7. FM demodulated signals are inputted at an integrator 5 via a switch 40 and the output therefrom is the output of the receiver 6. The selection control signals for control of the switch 40 are generated from a logical circuit 22. The circuit 22 receives as inputs the outputs both from the detectors 7 of the two systems and from the comparator 21. The comparators 21 input signals $l_1$ and $l_2$ which represent the received amplitude obtained by the receiving circuits 2 of the two systems. To the output of the comparator 21 are transmitted the signals which indicate which of the signals $l_1$ or $l_2$ is larger.

In the logical circuit 22, while the detector 7 of the one system is transmitting the signals indicating the performance deterioration, the switch 40 is controlled to select the output signals from the other receiving system. When both or neither of receiving systems output signals of performanc deterioration, the switch 40 is controlled to select the output from the receiving system having a larger amplitude in accordance with the output from the comparator 21. This enables avoiding the system where interference occurs from adjacent channels, so that a diversity receiver system can be realized to achieve greater improvement not only in the prevention of thermal noises but also of interference from adjacent channels. (When the threshold is controlled to achieve the maximum effect, an even greater improvement may be attained.)

Figure 22:
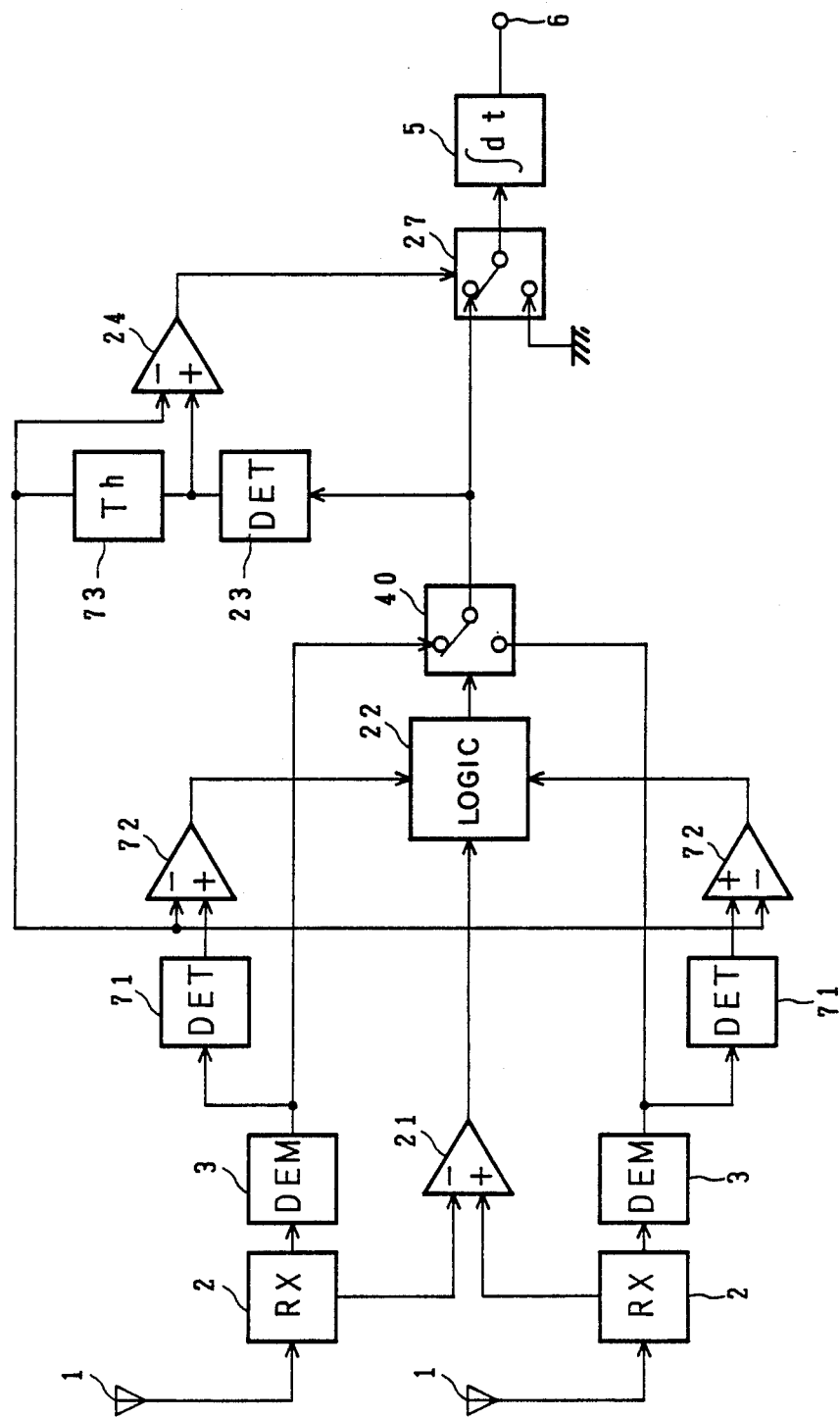
FIG. 22 is a block diagram of the ninth embodiment of this invention (modified diversity system).

FIG. 22 is a block diagram of the eighth embodiment of this invention which is a modification of the application of the invention to a diversity receiver system. This embodiment is provided with a circuit which can disconnect the demodulated signals from both of the receiving systems if interference occurs due to adjacent channels in both of the systems. More particularly, an amplitude detector 23 is provided at the output of the switch 40, and the output thereof is compared by the comparator 24 with the threshold generated by the generator 73. When the output from the detector 23 is larger, the switch 27 is turned off. Other structures are identical to those shown in relation to the seventh embodiment. When interference occurs from adjacent channels, received output is blocked off in the two receiving systems.

In this embodiment a threshold generator is shared by the two receiving systems. this structure is effective in simplifying circuits when using a complicated circuit for the generator.

Figure 23:
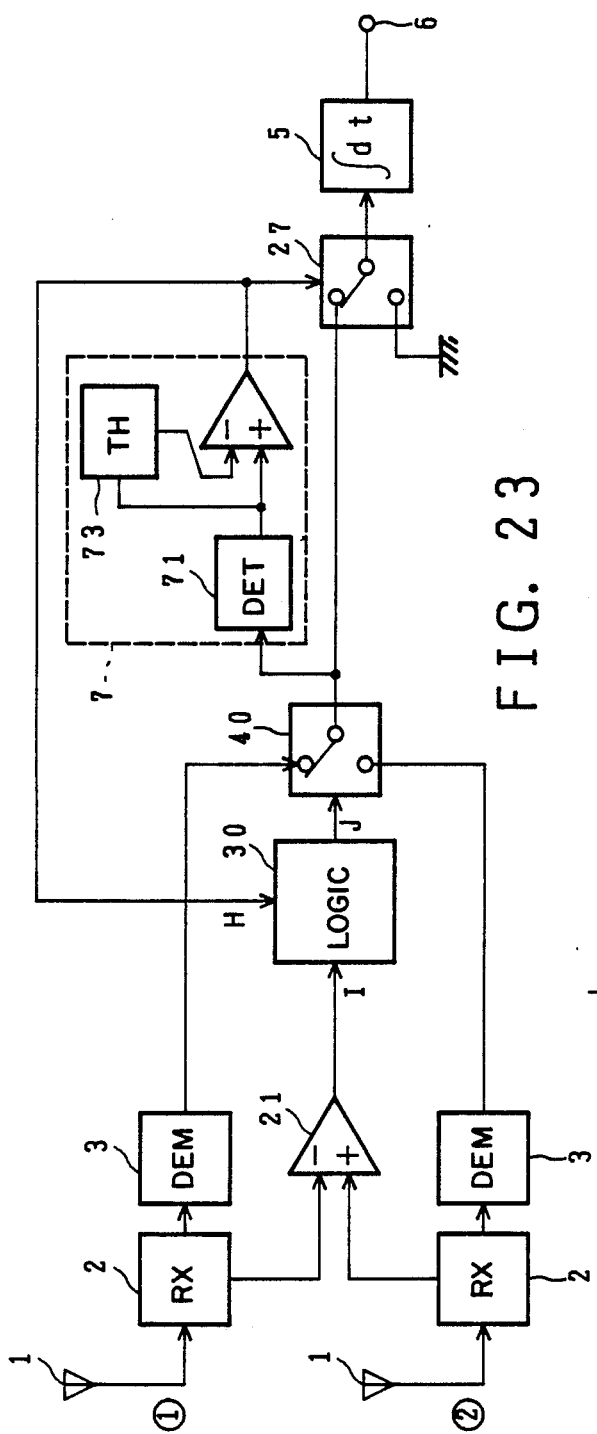
FIG. 23 is a block diagram of the tenth embodiment of this invention (modified diversity system).

FIG. 23 is a block diagram of the ninth embodiment of this invention. This is another example applied to diversity receiver systems. In the embodiment, when interference occurs due to adjacent channels in both of the systems simultaneously, the received output is disconnected, and at the same time the systems are alternated in a given cycle so that the output can be selected from the proper system as soon as the interference disappears from the system. The logical circuit 30 in FIG. 23 is structured to judge which system should be selected from the output of the comparator 21 (or the relation between the levels of received signals) and the output from the detector 7 (or the result of the performance detection of the signals after switching) and to control the switch 40.

Figure 24:
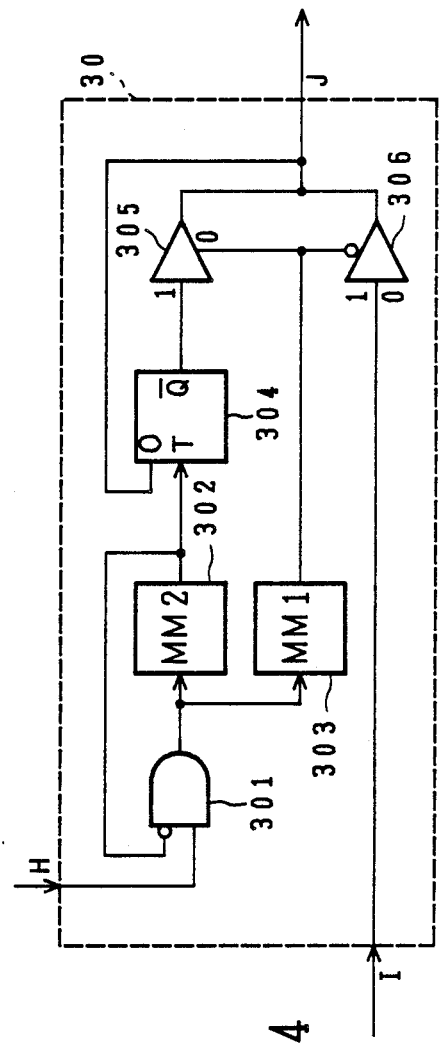
FIG. 24 is a diagram to show a logical circuit of the tenth embodiment.

FIG. 24 is a block diagram to show an example of the structure of the logical circuit 30 wherein the reference numeral 301 denotes a gate circuit, 302 and 303 monostable multi-vibrators, 304 a D flip-flop, and 305 and 306 a tri-state buffer. The input/output lines H, I, J correspond to those in FIG. 23. In this embodiment when no deterioration occurs in performance, the branch having a higher level of received signal envelopes is selected while when deterioration is detected in the signals after switching, it is switched to the output of the other system irrespective of the level of envelopes for a predetermined duration of time. When performance is being deteriorated also in the other system, branches are alternated in a predetermined cycle to seek for the system having no interference.

In the circuit shown in FIG. 24, when there is no H input (the result of deteriorated performance detection after signal switching), I input (relation of envelope levels) is passed through the buffer 306 to become J output as it is. When there is H input, the mono-stable multi-vibrator 303 becomes "High" for a predetermined time, Ti sec, to make the buffer 305 effective, and the output obtained by inverting the output before H input is outputted from Q output of the D flip-flop 304. If H input is still "High", the monostable multi-vibrator 302 repeated the inversion of the output from the D flip-flop 304 after a predetermined time $T_2$.

FIG. 25(i)–(vi) show waveforms for explaining the improvement in the quality of demodulated signals by this operation. FIGS. 25(i) and 25(ii) show FM demodulated signals of the systems. Both show the waveform which has passed through a low-pass filter. At the position where undesired signals become dominant over the desired signals due to the interference from adjacent channels, a step-like change occurs. FIG. 25(iii) shows the output from the comparator 21 of FIG. 23 showing the relation between the received signal envelope levels. It becomes "High" when the level of the second system (2) is higher than the other. Based on FIG. 25(iii), the first system (1) is selected, but the performance deteriorates at the time $t_1$, and the system is switched forcibly to the second system (2) for the time duration, $T_1$. After $T_1$ sec., it again selects the first system, but as it still has performance deterioration, the system is further switched to the second system (2). At the time $t_2$, as the second system also deteriorates in performance, branches should be alternated with each other at a time interval, $T_2$. The switching signals for selection are shown in FIG. 25(iv).

FIG. 25(v) shows the result of deterioration detection after switching of signals. Based on FIGS. 25(v) and 25(iii), the signals shown in FIG. 25(iv) are outputted. FIG. 25(iv) shows the output to disconnect the signals when deterioration occurs with the signals shown in FIG. 25(v). It can select the receiving system having no interference, and at the same time block off the signals if deterioration occurs in both of the systems to prevent generation of large noises. This attains a remarkable improvement in quality.

As this embodiment uses one common detector 7 for both of the receiving systems, it greatly simplifies the circuit structure. This is most effective when a complicated circuit is employed to achieve highly precise detection of deteriorated performance.

Figure 26A:
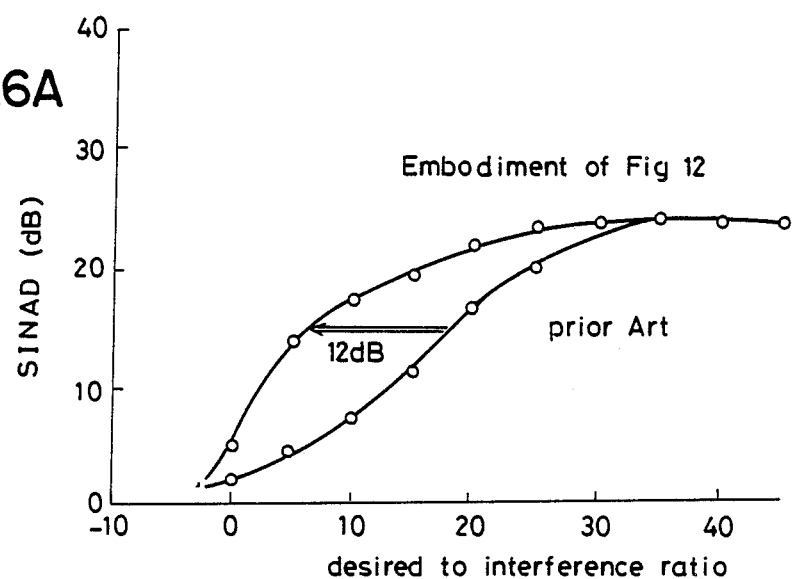
FIG. 26 is a view to show the result of experiments which demonstrates the improvement in SINAD of received signals according to this invention.
Figure 26B:
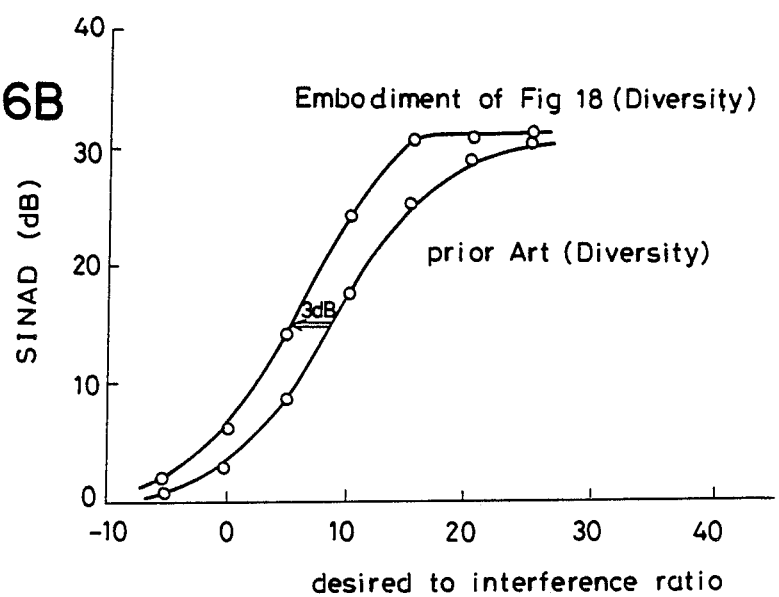

FIGS. 26(i) and 26(ii) are graphs to showing the improvement achieved experimentally by this invention in terms of ((signal+noise+distortion/(noise+distortion)) as SINAD of received signals. The graph 26(i) shows the comparison in characteristics between the structure of this invention shown in FIG. 3 with the threshold setting circuit of FIG. 12 and a prior art. For instance, at the point 10dB of desired signal against undesired signal ratio, this invention improves SINAD by 10dB.

The graph clearly shows that the ratio of desired wave against undesired wave which is required to make SINAD 15dB can be reduced by 12dB from the prior art. This means that the interval between adjacent channels can be reduced remarkably. In other words, in a mobile communication system with a smaller zone, adjacent channels are set at a short interval which was heretofore impossible.

FIG. 26(ii) shows an improvement achieved by the embodiment shown in FIG. 21 in SINAD of a diversity receiver. It is obvious from the graph that in addition to the improvement achieved generally by the diversity receiver, the ratio of desired wave against undesired wave required to increase to 15dB can be reduced by 3dB.

Industrial Applicability

As described in the foregoing, this invention can detect occurrence of interference due to adjacent channels from the absolute values of FM demodulated signals after they have passed through a low-pass filter or from the electric power of the FM demodulated signals after they passed through the band-pass filter, control the signals at that time by disconnection, amplitude limiting or interpolation, and use the detection for the logic for selection of diversity branches to thereby reduce the deterioration in quality of the signals which might otherwise be caused by adjacent channel interference.

This system of this invention can reduce large noises caused by the interference from adjacent channels. This system is further adaptive to reception conditions, and when deterioration is intensive, it can almost completely erase noises by allowing original signals to be disconnected more or less, thereby removing jarring noises and crosstalk. When performance is not deteriorated, the system can minimize the operation of disconnection to receive and reproduce the original signals faithfully. This invention reduces interference noises flexibly in accordance with the receiving conditions to thereby remarkably enhance the speech quality.

If the probability of interference is the same, application of this invention system can enhance the speech quality. Conversely, if the speech quality is constant, as this invention realizes use of adjacent channels at a smaller frequency interval and within a shorter distance, the application of this invention can realize a higher frequency efficiency.

What is claimed is:

1. A radio receiver of the type which uses one of plural radio channels arranged at a frequency interval and which receives angle-modulated signals transmitted to said one radio channel, and has a demodulator which demodulates the angle-modulated signal comprising:
   a circuit to detect deterioration in reception performance when an envelope of the demodulator output obtained by demodulating angle-modulated signals exceeds a threshold;
   a means to process received signals in accordance with a detection output from said circuit;
   wherein the means to process received signals includes a switch which becomes an open circuit with the output from the detector which passes the signals and detects deterioration in reception performance, and an interpolation circuit which outputs interpolation signals of the received signals in replacement thereof when the switch is open.

2. The radio receiver as claimed in claim 1 wherein the interpolation circuit includes a circuit which repeats the waveform of the signal received immediately before the switch became an open circuit in output therefrom.

3. The radio receiver as claimed in claim 1 wherein the received signals are speech signals obtained by demodulating the angle-modulated signals.

4. A radio receiver of the type which uses one of plural radio channels arranged at a frequency interval and which receives angle-modulated signals transmitted to said one radio channel, and has a demodulator which demodulates the angle-modulated signal comprising:
   a circuit to detect deterioration in reception performance when an envelope of the demodulator output obtained by demodulating angle-modulated signals exceeds a threshold; and
   a means to process received signal in accordance with a detection output from said circuit;
   wherein the means to process received signals includes a means to correct errors of digital signals which have been encoded for error correction regarding the position where the error occurs as identical to the position where the deterioration of reception performance occurs.

* * * * *